United States Patent [19]

Sone

[11] Patent Number: 6,150,684

[45] Date of Patent: Nov. 21, 2000

[54] THIN-FILM CAPACITOR AND METHOD OF PRODUCING SAME

[75] Inventor: Shuji Sone, Tokyo, Japan

[73] Assignee: NEC Corporation, Tokyo, Japan

[21] Appl. No.: 09/317,857

[22] Filed: May 25, 1999

[30] Foreign Application Priority Data

May 25, 1998 [JP] Japan .................................. 10-142909
Sep. 1, 1998 [JP] Japan .................................. 10-246849

[51] Int. Cl.$^7$ .................................................. H01L 29/76

[52] U.S. Cl. ........................................................ 257/295

[58] Field of Search ..................................... 257/295, 296

[56] References Cited

U.S. PATENT DOCUMENTS

| | | |
|---|---|---|
| 5,814,849 | 9/1998 | Azuma et al. . |
| 5,818,079 | 10/1998 | Noma et al. . |
| 5,907,470 | 5/1999 | Kita et al. . |
| 6,025,619 | 2/2000 | Azuma et al. . |

FOREIGN PATENT DOCUMENTS

| | | |
|---|---|---|
| 4-276650 | 10/1992 | Japan . |
| 5-55514 | 3/1993 | Japan . |
| 6-333419 | 12/1994 | Japan . |
| 7-267731 | 10/1995 | Japan . |
| 9-223777 | 8/1997 | Japan . |

OTHER PUBLICATIONS

Kawahara, et al., "Surface Morphologies and Electrical Properties of (Ba, Sr) TiO3 Films Prepared by Two–Step Deposition of Liquid Source Chemical Vapor Deposition", Jpn. J. Appl. Phys. vol. 34 (1995) pp. 5077–5082, Part 1, No. 9B, Sep. 1995.

Fujii, et al., "Preparation of PbTiO3 thin films by plasma–enhanced metalorganic chemical vapor deposition", Appl. Phys. Lett., vol. 65 No. 3, Jul. 18, 1994.

Primary Examiner—Stephen D. Meier
Attorney, Agent, or Firm—McGinn & Gibb, P.C.

[57] ABSTRACT

A thin-film capacitor having a perovskite-structured polycrystalline oxide thin-film as its dielectric, that exhibits an excellent insulation property is provided. This capacitor comprises a perovskite-structured, polycrystalline oxide thin-film, and top and bottom electrodes located at each side of the thin-film The perovskite-structured, polycrystalline oxide thin-film has a general formula of $ABO_3$, where A is at least one element selected from the group consisting of bivalent metallic elements, lead, and lanthanum, and B is at least one element selected from the group consisting of quadrivalent metallic elements. A ratio of (A/B) is in a range from 1.1 to 2.0. The oxide thin-film has granular crystal grains. The perovskite-structured, polycrystalline oxide thin-film is formed by forming a perovskite-structured, amorphous oxide thin-film and by crystallizing the perovskite-structured, amorphous oxide thin-film due to heat treatment.

7 Claims, 11 Drawing Sheets

THIN-FILM CAPACITOR AND METHOD OF PRODUCING SAME

BACKGROUND OF THE INVENTION

1. Field of the Invention

The present invention relates to a thin-film capacitor and a method of producing the same and more particularly, to a thin-film capacitor using a "perovskite-structured" oxide film as its dielectric intervening between a pair of electrodes, which is suitably used for Large-Scale Integrated circuits (LSIs), and a method of producing the capacitor.

2. Description of the Prior Art

To realize the next-generation 1-Gigabit (Gbit) or greater Random-Access Memories (DRAMs), conventionally, various research an development have been made for practically utilizing perovskite-structured oxides, such as $(Ba,Sr)TiO_3$ (i.e., BST), $(Pb,Zr)TiO_3$ (i.e., PZT), and so on, as a capacitor dielectric of the storage capacitors. This is because perovskite-structured oxides are excellent in dielectric characteristic, insulation performance, and chemical stability.

Sputtering, Chemical Vapor Deposition (CVD), and sol-gel methods have been known as typical methods of making a perovskite-structured oxide thin-film. To realize Gbit-class DRAMs, the well-known "stacked-capacitor" structure needs to be used for their storage cells and at the same time, the sidewalls of the stacked capacitors need to be effectively utilized to obtain the capacitance as high as possible. Thus, CVD methods having an excellent step-coverage property are preferred for this purpose. From this point of view, there has been the strong need to establish the film-formation method of perovskite-structured oxides using CVD in the field of LSIs.

It was reported by E. Fujii et al. that perovskite-structured polycrystalline oxide thin-films formed by CVD had a columnar grain structure, in other words, they are formed by columnar crystal grains, in the treatise entitled "Preparation of $PbTiO_3$ thin films by plasma-enhanced metalorganic chemical vapor deposition", Applied Physics Letters, Vol. 65, No. 3, pp. 365–367, Jul. 18, 1994.

In general, to apply perovskite-structured polycrystalline oxide thin-films to Gbit-class DRAMs, it is required for the thin-films to have a small thickness of approximately 30 nm or less for the purpose of decreasing the equivalent silicon-dioxide ($SiO_2$) thickness $t_{eq}$. With the perovskite-structured polycrystalline oxide thin-films having the columnar grain structure, however, comparatively large irregularity or roughness exists on the film surface, which varies dependent upon the size of the columnar grains. The surface irregularity or roughness of the perovskite-structured oxide thin-film leads to the roughness of the interface between the dielectric and the top electrode of the capacitor. As a result, when a voltage is applied across the top and bottom electrodes of the capacitor, electric-field concentration tends to occur at the interface of the dielectric and the top electrode, causing some problems, such as increase in leakage current, degradation in dielectric breakdown characteristic, and so on.

On the other hand, it was reported by T. Kawahara et al. that the current leakage was improved by the use of BST thin-films formed by a two-step deposition process (i.e., two-step thermal CVD processes) in the treatise entitled "Surface Morphologies and Electrical Properties of (Ba,Sr)$TiO_3$ Films Prepared by Two-Step Deposition of Liquid Source Chemical Vapor Deposition", Japan Journal of Applied Physics, Vol. 34, pp. 5077–5082, Part 1, No. 9B, September 1995.

With the two-step deposition process disclosed in the treatise by Kawahara et al., the BST film is formed through the steps shown in FIG. 1. Specifically, a bottom electrode is formed in the step S101 and then, a first BST film of approximately 5 nm in thickness is formed on the bottom electrode at a deposition temperature of 420° C. in the step S102. The first BST film is then subjected to heat treatment in the step S103, thereby crystallizing the first BST film. Subsequently, a second BST film is formed on the first BST film at a same deposition temperature of 420° C. in the step S104 so that the first and second BST films have a total thickness of 30 nm. The second BST film is then subjected to heat treatment in the step S105, thereby crystallizing the second BST film. Finally, a top electrode is formed on the second BST film in the step S106. Thus, a thin-film capacitor is completed.

It is seen from the treatise by Kawahara et al. that the resultant surface flatness of the second BST film is improved and accordingly, the equivalent $SiO_2$ thickness $t_{eq}$ is 0.56 nm and the leakage current density is $1.2 \times 10^{-8}$ A/cm$^2$ at an applied voltage of 1.1 V.

To apply perovskite-structured polycrystalline oxide thin-films to capacitor dielectrics of Gbit-class DRAMs, however, it is necessary to suppress the oxidation reaction of the bottom electrode occurring at the interface of the bottom electrode and the capacitor dielectric during the growth process of a perovskite-structured oxide. This is because an oxide is formed at the interface due to oxidation of the surface of the bottom electrode to serve another capacitor dielectric together with the perovskite-structured oxide, arising a problem that the effective or resultant dielectric constant of the capacitor dielectric is lowered.

Also, it is necessary to suppress the oxidation reaction of a silicon part or a silicon substrate located below the bottom electrode during the growth process of a perovskite-structured oxide. For example, if a polysilicon plug interconnecting the bottom electrode with a diffusion region formed in the silicon substrate is provided, the polysilicon plug tends to be oxidized at the interface of the bottom electrode and the plug. Thus, a problem that contact resistance of the plug with the bottom electrode is raised will occur.

As a result, it is required that the growth temperature of a perovskite-structured oxide is as low as possible (e.g., lower than 420° C.).

Moreover, from the viewpoint of productivity, the two-step deposition disclosed by T. Kawahara et al. is not preferred because of the increased number of necessary process steps. It is required to realize a simple method of making a perovskite-structured oxide.

SUMMARY OF THE INVENTION

Accordingly, an object of the present invention to provide a thin-film capacitor having a perovskite-structured oxide thin-film as its dielectric, that exhibits an excellent insulation property, such as current leakage and dielectric breakdown, and a method of producing the capacitor.

Another object of the present invention to provide a thin-film capacitor having a perovskite-structured oxide thin-film as its dielectric, in which the perovskite-structured oxide thin-film is formed at a temperature low enough to solve the above-described problems through simple processes, and a method of producing the capacitor.

The above objects together with others not specifically mentioned will become clear to those skilled in the art from the following description.

According to a first aspect of the present invention, a thin-film capacitor is provided, which is comprised of a perovskite-structured oxide thin-film, a bottom electrode located at one side of the thin-film, and a top electrode located at the other side of the thin-film.

The oxide thin-film has a general formula of $ABO_3$, where A is at least one element selected from the group consisting of bivalent metallic elements, lead (Pb), and lanthanum (La), and B is at least one element selected from the group consisting of quadrivalent metallic elements, a ratio of (A/B) (i.e., a molar ratio of the element A to the element B in the formula $ABO_3$) is in a range from 1.1 to 2.0. The oxide thin-film has a granular structure of crystal grains.

With the thin-film capacitor according to the first aspect of the present invention, the perovskite-structured oxide thin-film has the above-described general formula of $ABO_3$ and the granular structure of crystal grains, and therefore, current leakage and dielectric breakdown are improved. In other words, this thin-film capacitor exhibits an excellent insulation property.

According to a second aspect of the present invention, a method of producing a thin-film capacitor is provided. This method makes it possible to produce the thin-film capacitor according to the first aspect of the present invention.

In a first step, a bottom electrode is formed.

In a second step, a perovskite-structured, amorphous oxide thin-film is formed on the bottom electrode. The oxide thin-film has a general formula of $ABO_3$, where A is at least one element selected from the group consisting of bivalent metallic elements, lead, and lanthanum, and B is at least one element selected from the group consisting of quadrivalent metallic elements.

In a third step, the amorphous oxide thin-film is crystallized due to heat treatment to have a granular structure of crystal grains.

In a fourth step, a top electrode is formed on the crystallized oxide thin-film to be opposite to the bottom electrode through the crystallized oxide thin-film.

With the method of forming a thin-film capacitor according to the second aspect of the present invention, after a perovskite-structured, amorphous oxide thin-film is formed on a bottom electrode to have the above-described general formula of $ABO_3$, the amorphous oxide thin-film is crystallized due to heat treatment to have a granular structure of crystal grains. Accordingly, the perovskite-structured oxide thin-film can be formed at a temperature low enough to solve the above-described problems without using the prior-art two-step deposition, i.e., through simple processes.

DETAILED DESCRIPTION OF THE INVENTION

The present invention will be described in detail below.

It has been known that a perovskite-structured polycrystalline oxide has a "columnar" or "granular" structure of crystal grains, which is dependent upon the composition of the oxide and the formation method thereof.

When a perovskite-structured polycrystalline oxide thin-film has the "columnar" structure, grain boundaries are arranged in the thin-film approximately vertically with respect to the thin-film itself. The surface of the thin-film has a roughness corresponding to the grain size. As result, the interface of the thin-film and the top electrode has comparatively large roughness, causing some disadvantages, such as leakage current increase and breakdown property degradation.

On the other hand, when a perovskite-structured polycrystalline oxide thin-film has the "granular" structure, minute crystal grains are closely arranged or packed at random in the thin-film. Grain boundaries are arranged irregularly. It is said that the granular structure is an aggregation of minute crystal grains. Therefore, the surface of the thin-film has a small roughness, in other words, the interface of the thin-film and the top electrode has very small roughness (i.e., excellent evenness). As a result, compared with the "columnar" structure, both of the leakage current and breakdown property are improved.

In the present invention, to form the granular structure, a perovskite-structured, amorphous oxide thin-film is formed on the bottom electrode in the second step and then, the amorphous thin-film thus formed is crystallized in the third step due to heat treatment.

Here, the general formula of the oxide thin-film is defined as $ABO_3$, where A is at least one element selected from the group consisting of bivalent metallic elements, lead, and lanthanum, and B is at least one element selected from the group consisting of quadrivalent metallic elements. Any one or ones of bivalent metallic elements may be used as the element A. Any one or ones of quadrivalent metallic elements may be used as the element B.

The ratio of (A/B), i.e., the molar ratio of the element A to the element B in the formula $ABO_3$, is set in a range from 1.1 to 2.0 in the present invention. In other words, the molar ratio of the element A is greater than that of the element B. Thus, unlike the case where (A/B)=0.8 to 1.0, the perovskite-structured polycrystalline oxide thin-film with the granular structure can be formed with very good reproducibility.

If the ratio of (A/B) is greater than 2.0, the resultant leakage current is successive or unsatisfactorily large and the relative dielectric constant is insufficiently low. If the ratio of (A/B) is less than 1.1, no satisfactory granular structure can be formed.

It is important that he formation or growth temperature of the perovskite-structured amorphous oxide thin-film in the second step is set at a temperature ranging from 50° C. to 300° C. If the formation or growth temperature is higher than 300° C., crystalline nuclei tend to be formed within the perovskite-structrued amorphous oxide thin-film. Since the crystalline nuclei constitute leaking paths, the leakage current will increase. Thus, it is essential for the invention to set the growth temperature in the second step to be equal to or lower than 300° C. On the other hand, if the formation or growth temperature is lower than 50° C., the perovskite-structured crystallized oxide thin-film does not have a sufficiently-high relative dielectric constant.

Because of the low growth temperature range (i.e., 50° C. to 300° C.) of the perovskite-structrued amorphous oxide thin-film in the second step, surface oxidation of the bottom electrode can be suppressed or prevented in the second step even in the bottom electrode is made of a metallic material, such as ruthenium (Ru), iridium (Ir), tungsten (W), or platinum (Pt). Accordingly, a suitable metallic material causing no problem about hydrogen reduction and providing good surface evenness listed here can be used for the bottom electrode. The use of a suitable metallic material of this sort leads to improvement in capacitor performance.

To realize the granular grain structure in the third step of crystallizing the perovskite-structured amorphous oxide thin-film, it is preferred that the third step is carried out by a Rapid Thermal Annealing (RTA) process. This RTA process is preferably carried out under the condition that the annealing temperature is set to be equal to or greater than 650° C. and less than 750° C. (more preferably, in the range from 650° C. to 700° C.), the annealing time is set as 1 sec to 10 sec, and the annealing atmosphere is set as an nitrogen or inert gas atmosphere. In this case, the perovskite-structured polycrystalline oxide thin-film with the granular grain structure can be formed with very good reproducibility.

Each of the bottom and top electrodes may be made of any conductive material. However, it is preferred that each of the bottom and top electrodes is made of a metallic material, because the advantages of the present invention are more effective. The top electrode may be made of a same metallic material as or different metallic material from that of the bottom electrode.

It is preferred that each of the top and bottom electrodes is made of a metallic material having a good surface evenness, such as ruthenium, iridium, tungsten, or platinum. This leads to improvement in capacitor performance.

As explained above, unlike the previous-described prior art, there are the advantages that the growth temperature of the perovskite-structured amorphous oxide thin-film can be lowered to 50° C. to 300° C. and that the perovskite-structured polycrystalline oxide thin-film can be formed through a single growth or deposition step without using the prior-art two-step deposition method.

In a proffered embodiment the present invention, as the bivalent metallic elements of the element A in the general formula $ABO_3$, at least one of strontium (Sr), barium (Ba), lead (Pb), and lanthanum (La) are used. As the quadrivalent metallic elements of the element B in the general formula $ABO_3$, at least one of titanium (Ti), zirconium (Zr), and tin (Sn) are used.

If two elements X and Y are used as the element A, the general formula is expressed as $(X,Y)BO_3$. If two elements X' and Y' are used as the element B, the general formula is expressed as $A(X',Y')O_3$.

It is preferred that the second step is carried out by a plasma-enhanced CVD process such as an Electron Cyclotron Resonance (ECR) plasma-enhanced CVD process. However, any other one of various CVD processes or any sol-gel method may be used for this purpose, if it can form a perovskite-structured, amorphous oxide thin-film on the bottom electrode.

It is preferred that the bottom electrode is placed over a silicon layer, and a barrier film is formed to intervene between the silicon layer and the bottom electrode. The barrier film serves to prevent the bottom electrode from reacting with the silicon layer.

BRIEF DESCRIPTION OF THE DRAWINGS

In order that the present invention may be readily carried into effect, it will now be described with reference to the accompanying drawings.

EXAMPLES

The present invention will be explained in more detail with reference to the following examples.

Example 1

Figure 4:
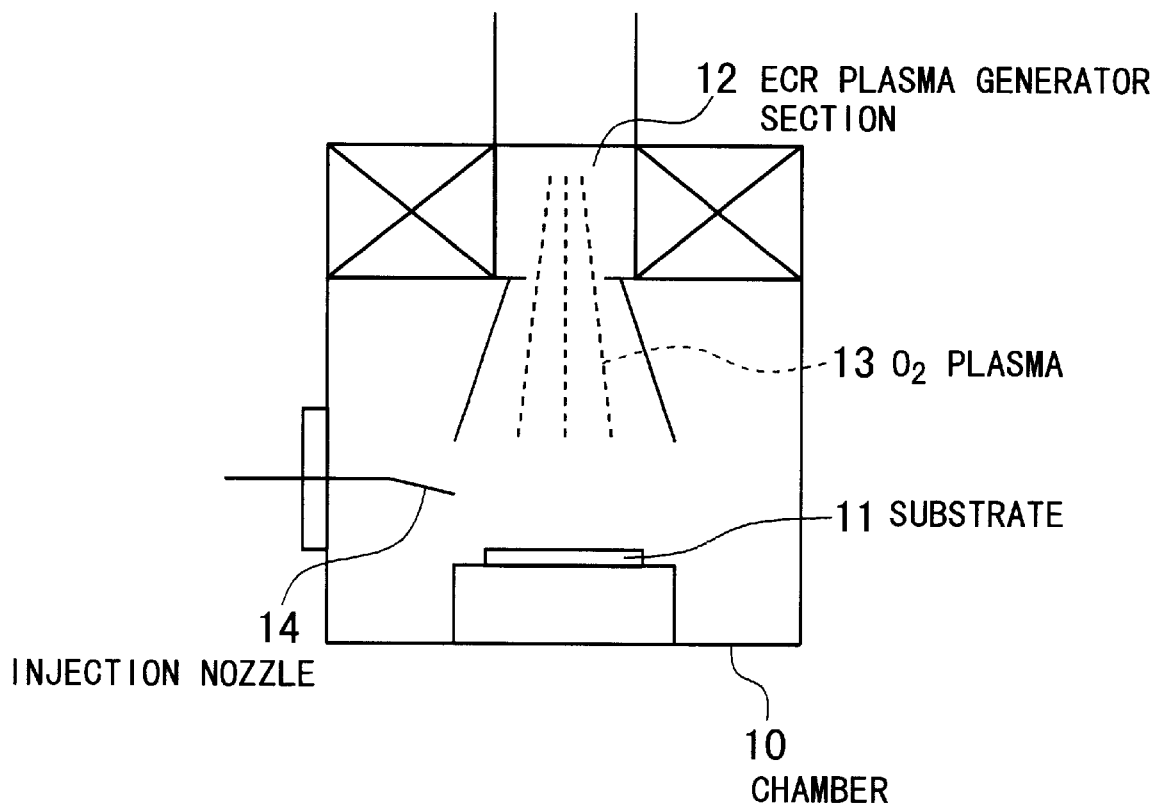
FIG. 4 is a schematic diagram showing the configuration of the reaction chamber of a ECR plasma-enhanced CVD apparatus.

FIG. 4 shows schematically the reaction or growth chamber 10 of a ECR plasma-enhanced CVD apparatus used in this example. Oxygen ($O_2$) plasma 13 is generated in an ECR plasma generator section 12 provided at the top of the chamber 10. The plasma 13 is then injected into the chamber 10, as shown in FIG. 4. On the other hand, necessary metalorganic (MO) materials are introduced in the chamber 10 through an injection nozzle 14. The introduced MO materials are chemically reacted with one another in the chamber 10 under the action of the plasma 13, thereby depositing a perovskite-structured oxide thin-film (not shown) on a substrate 11. The temperature of the substrate 11 can be adjusted in the range from 100° C. to 700° C.

Figure 1:
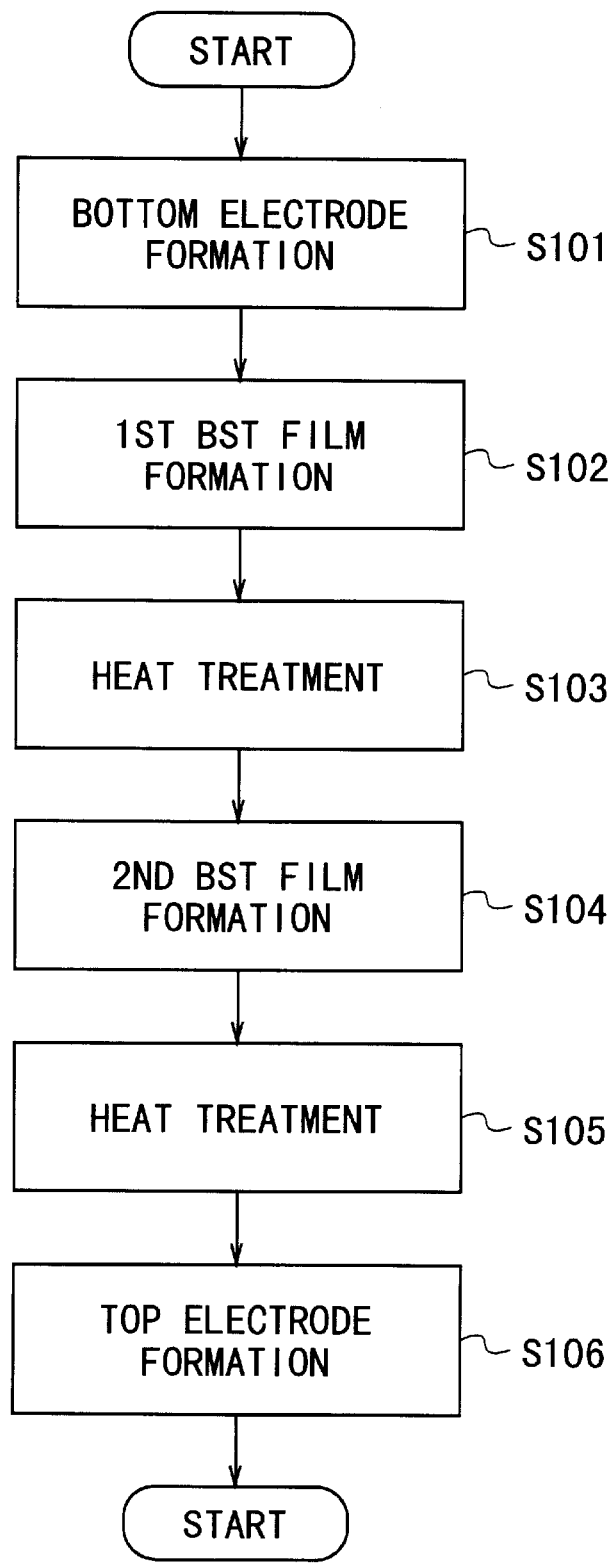
FIG. 1 is a flow chart showing a conventional method of producing a thin-film capacitor.
Figure 2:
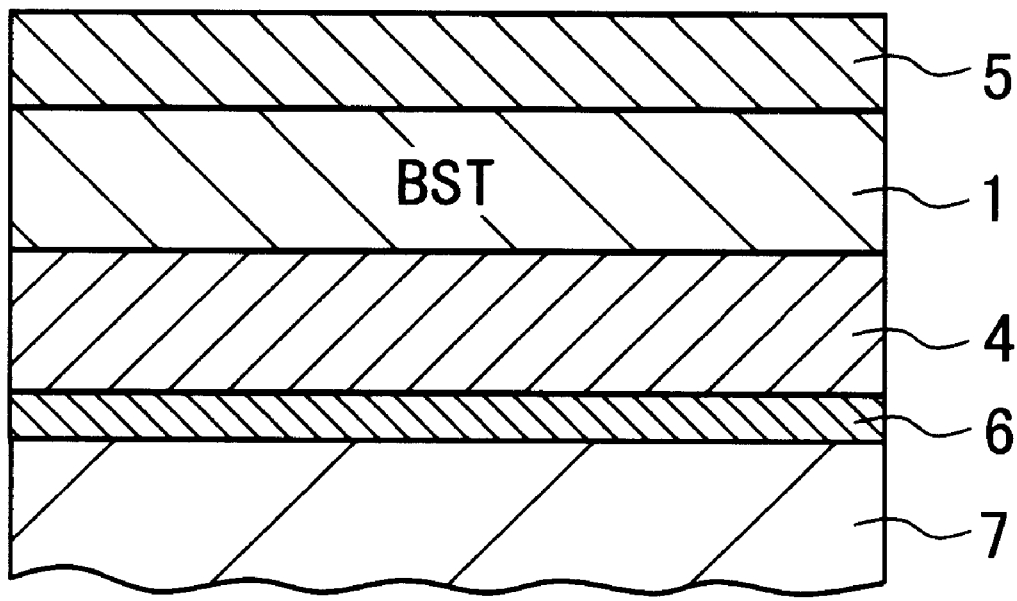
FIG. 2 is a partial cross-section of a thin-film capacitor according to a first example of the present invention.

In Example 1, a thin-film capacitor shown in FIG. 2 was produced in the following way.

First, a barrier film 6 (20 nm in thickness) was formed on a main surface of a single-crystal silicon (Si) substrate or wafer 7 (6 inches in diameter) by sputtering. The barrier film 6 was made of titanium nitride (TiN).

Figure 3:
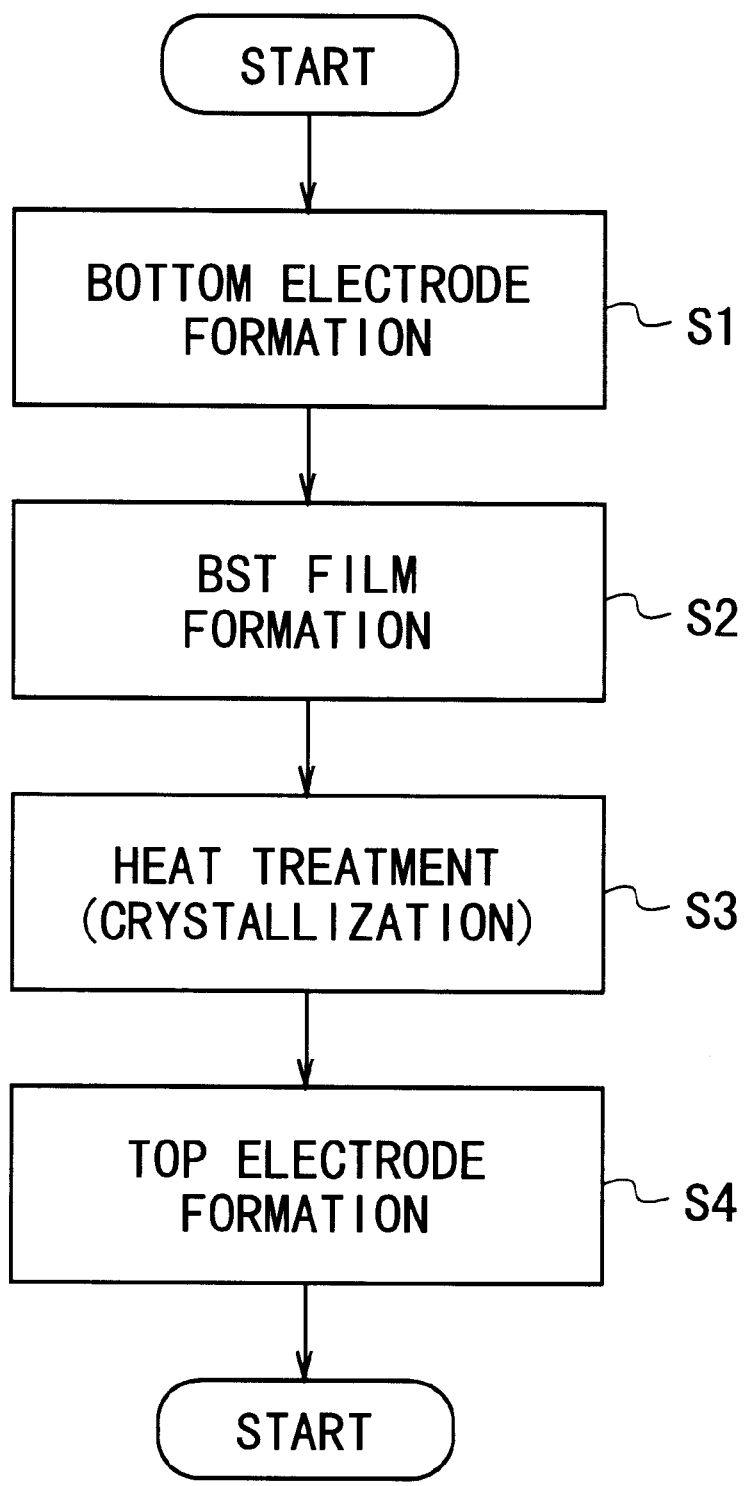
FIG. 3 is a flow chart showing a method of producing the thin-film capacitor according to the first example of FIG. 2.

Then, as shown in FIG. 3, a bottom electrode 4 (100 nm in thickness) was formed on the barrier film 6 by sputtering (step S1 in FIG. 3). The bottom electrode 4 was made of ruthenium (Ru). The barrier film 6 serves to prevent the Ru bottom electrode 4 from chemically reacting with the underlying Si substrate 7.

Next, the substrate or wafer 7 with the barrier film 6 and the bottom electrode 4 was introduced into the growth chamber 10 of the ECR plasma-enhanced CVD apparatus shown in FIG. 4. A perovskite-structured, amorphous oxide thin-film 1 (30 nm in thickness) was formed on the bottom electrode 4 at a growth temperature of 120° C. (step S2 in FIG. 3). As the perovskite-structured, amorphous oxide thin-film 1, so-called BST [$(Ba,Sr)TiO_3$] was used. The ratio of (Ba+Sr)/Ti was changed in the range from 0.8 to 2.1 at equal intervals of 0.1.

Here, bis(dipivaloymethanate)barium [Ba(DPM)$_2$] was used as the barium (Ba) source, bis(dipivaloymethanate)strontium [Sr(DPM)$_2$] was used as the strontium (Sr) source, and titanium isopropoxide [Ti(O—i—C$_3$H$_7$)$_4$] was used as the titanium (Ti) source.

Subsequently, the substrate 7 on which the TiN barrier film 6, the Ru bottom electrode 4, and the BST capacitor dielectric thin-film 1 are stacked was taken out of the chamber 10 of the CVD apparatus of FIG. 4, and then, introduced into a chamber of an RTA apparatus (not shown). In this RTA apparatus, the BST perovskite-structured, amorphous oxide thin-film 1 was subjected to heat treatment (i.e., RTA process) (step S3 in FIG. 3). In this process, the substrate 7 was placed in an N$_2$ atmosphere while raising the ambient temperature from room temperature to 700° C. at a rate of 30° C./sec or lower. Then, the substrate 7 was kept in the N$_2$ atmosphere at 700° C. for 5 seconds. As a result, the BST perovskite-structured, amorphous oxide thin-film 1 was crystallized, i.e., the BST perovskite-structured, polycrystalline oxide thin-film 1 was formed.

Finally, a top electrode 5 (50 nm in thickness) was formed on the BST perovskite-structured, polycrystalline oxide thin-film 1 by sputtering (step S4 in FIG. 3). The top electrode 5 was made of the same material as that of the bottom electrode 4, i.e., ruthenium.

Through the above-described steps, the thin-film capacitor of Example 1 was completed.

The leakage current density and the relative dielectric constant of the thin-film capacitor thus produced were measured by the known methods, resulting in FIGS. 5 to 10.

Figure 5:
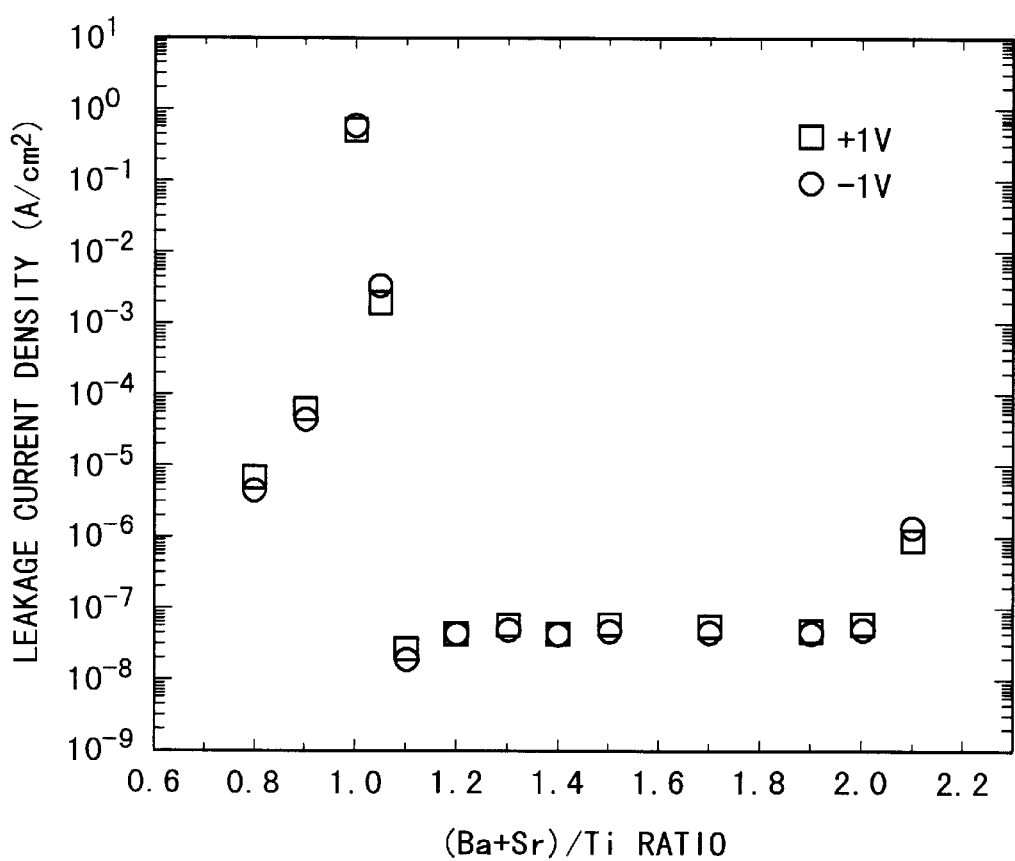
FIG. 5 is a graph showing the relationship between the leakage current density and the ratio of (Ba+Sr)/Ti, which was obtained in the first example of FIG. 2.

FIG. 5 shows the (Ba+Sr)/Ti dependence of the leakage current density, where a voltage of ±1 V was applied across the thin-film capacitor. As seen from FIG. 5, the leakage current density was in the order of $10^{-8}$ A/cm$^2$ when the ratio of (Ba+Sr)/Ti was in the range of 1.1 to 2.0. When the ratio of (Ba+Sr)/Ti was equal to 1.05 or less, the leakage current density was increased abruptly. In particular, the leakage current density was extremely large when the ratio of (Ba+Sr)/Ti was equal to 1.0. When the ratio of (Ba+Sr)/Ti was equal to 2.1 or greater, the leakage current density had a tendency to increase.

Figure 6:
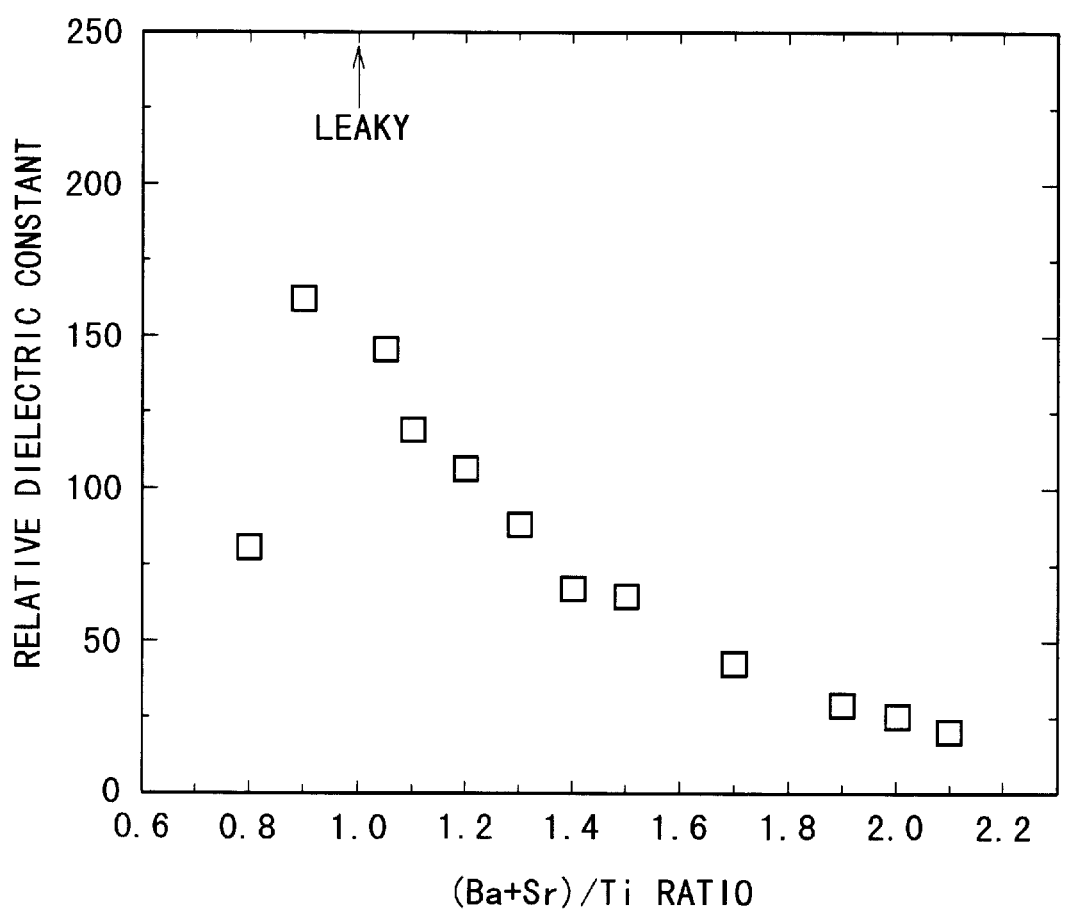
FIG. 6 is a graph showing the relationship between the relative dielectric constant and the ratio of (Ba+Sr)/Ti, which was obtained in the first example of FIG. 2.

FIG. 6 shows the (Ba+Sr)/Ti dependence of the relative dielectric constant. As seen from FIG. 6, when the ratio of (Ba+Sr)/Ti was in the preferred range of 1.1 to 2.0, in which the leakage current density was satisfactorily low, the relative dielectric constant was from 25 to 120, which was satisfactorily high for the storage capacitors of LSIs.

Thus, it was seen from FIGS. 5 and 6 that the preferred ratio of (Ba+Sr)/Ti was from 1.1 to 2.0.

The character "LEAKY" in FIG. 6 denotes that measurement of the relative dielectric constant was impossible because current leakage was much leaky.

Figure 7:
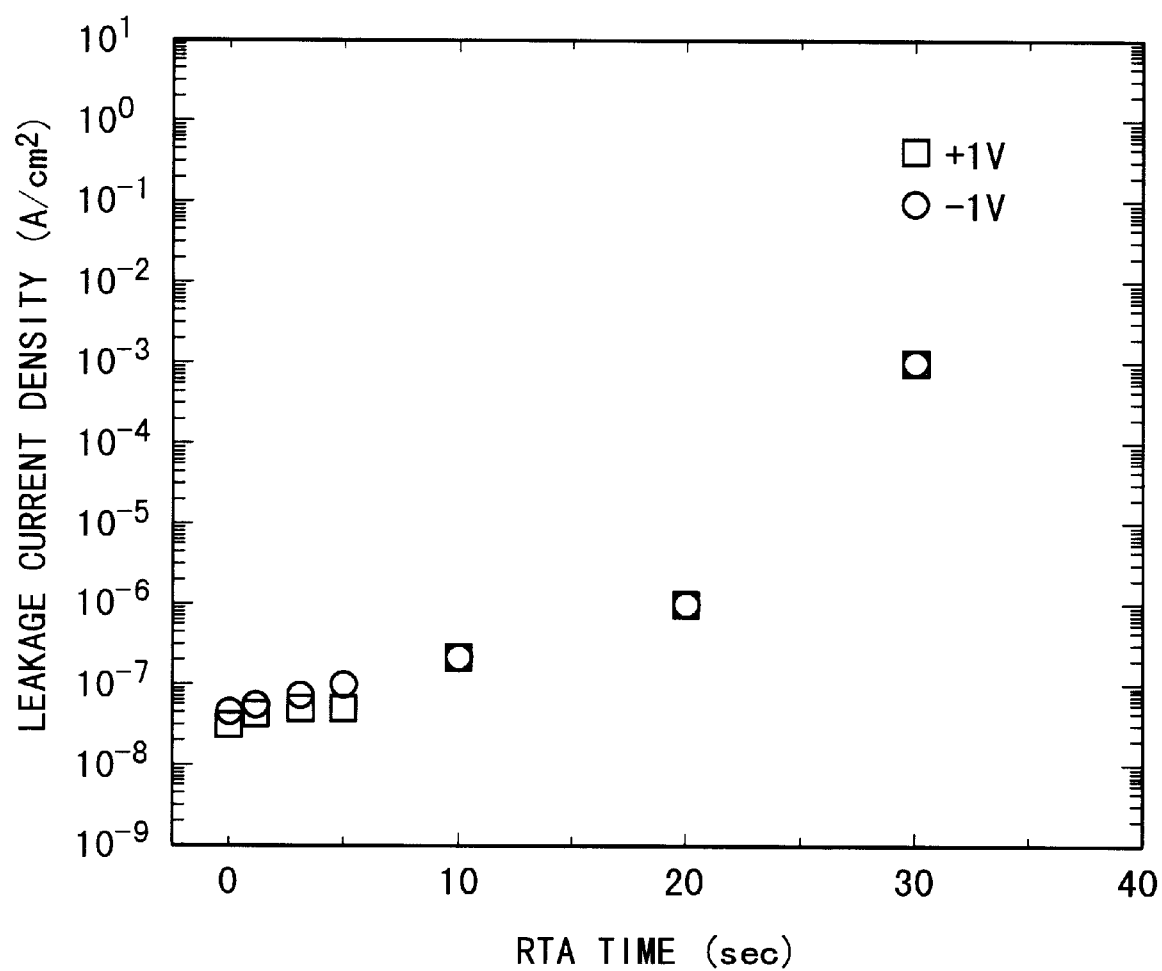
FIG. 7 is a graph showing the relationship between the leakage current density and the RTA time in the crystallization process, which was obtained in the first example of FIG. 2.
Figure 8:
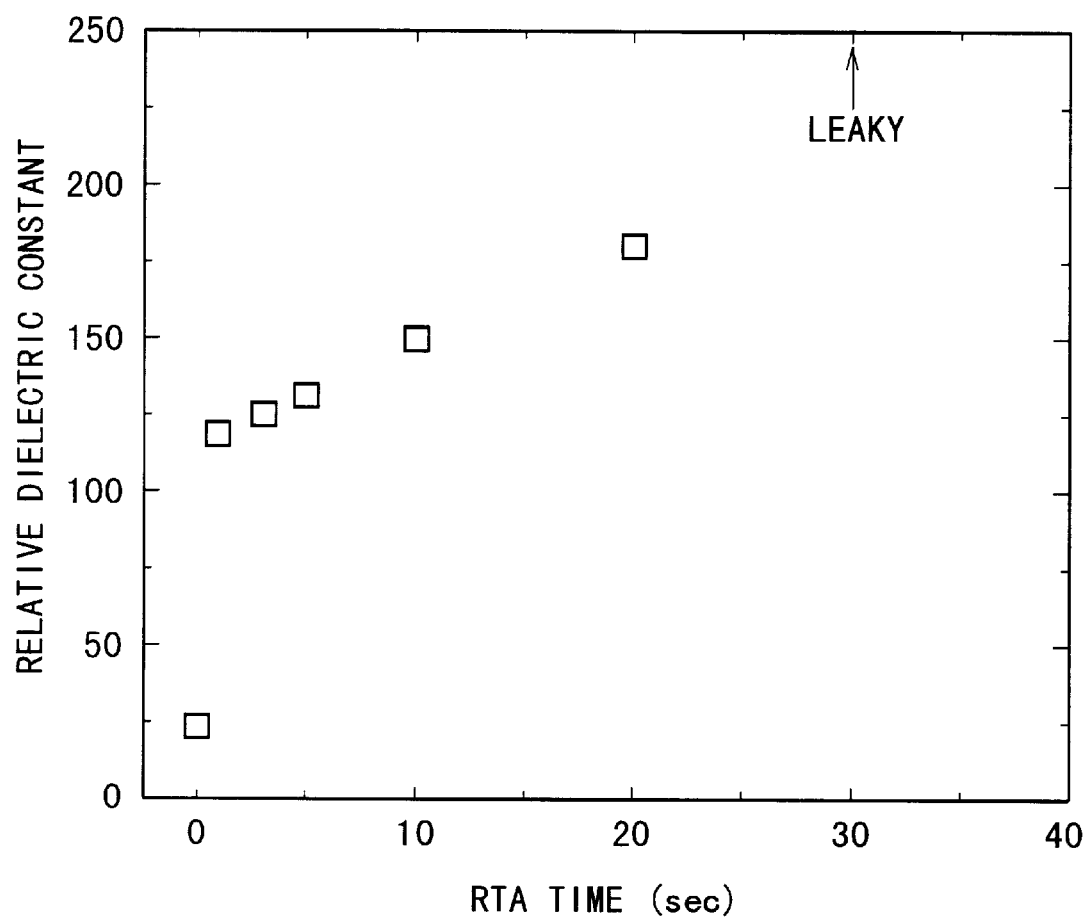
FIG. 8 is a graph showing the relationship between the relative dielectric constant and the RTA time in the crystallization process, which was obtained in the first example of FIG. 2.

FIG. 7 shows the RTA-time dependence of the leakage current density in the crystallization process, and FIG. 8 shows the RTA-time dependence of the relative dielectric constant, which were obtained in the following way.

After forming the perovskite-structured, amorphous BST thin-film 1 having the ratio of (Ba+Sr)/Ti of 1.1 was deposited on the bottom electrode 4 at a growth temperature of 120° C., the amorphous BST thin-film 1 was subjected to heat treatment (i.e., RTA annealing) in an N$_2$ atmosphere while raising the ambient temperature from room temperature to 700° C. at a rate of 30° C./sec or lower. Then, the film 1 was kept in the N$_2$ atmosphere at 700° C. for 1 to 30 seconds.

As seen from FIG. 7, the leakage current density was in the order of $10^{-8}$ A/cm$^2$ to $10^{-7}$ A/cm$^2$ while the RTA time was varied from 1 sec to 10 sec. As seen from FIG. 8, the relative dielectric constant was from 120 to 150 while the RTA time was varied from 1 sec to 10 sec. These values of the leakage current density and the relative dielectric constant were satisfactory for the storage capacitors of LSIs.

Figure 9:
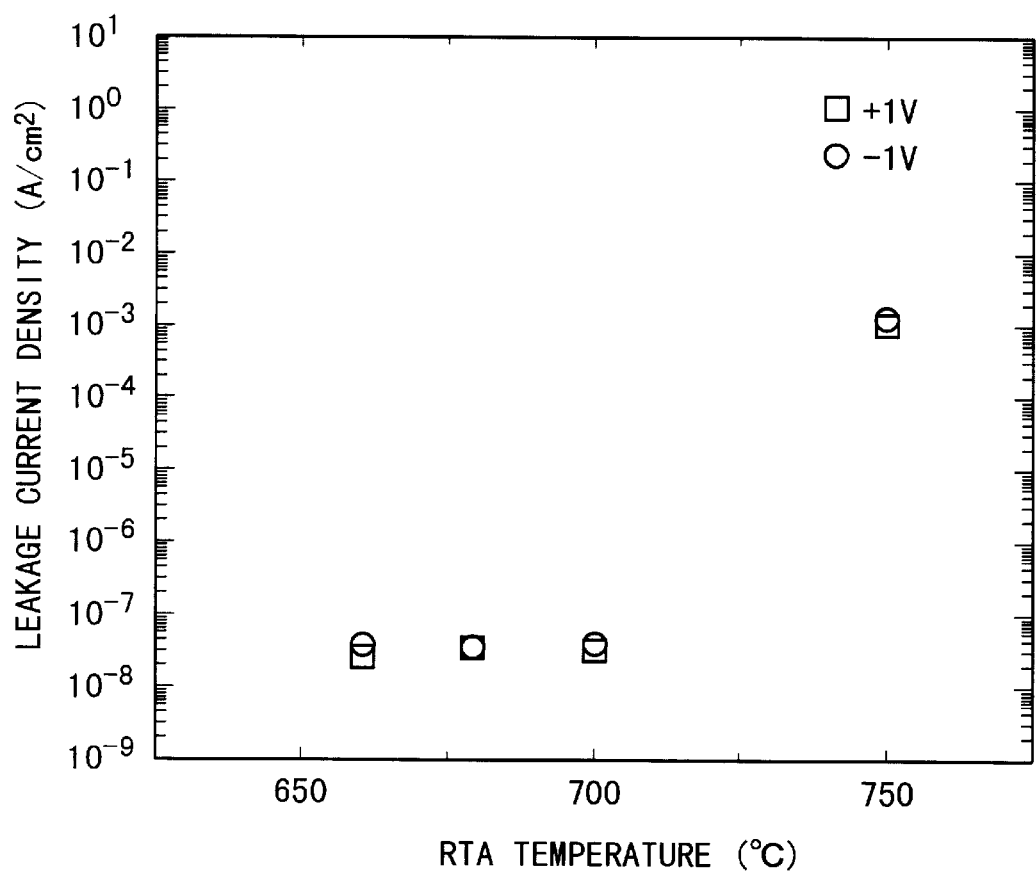
FIG. 9 is a graph showing the relationship between the leakage current density and the RTA temperature in the crystallization process, which was obtained in the first example of FIG. 2.
Figure 10:
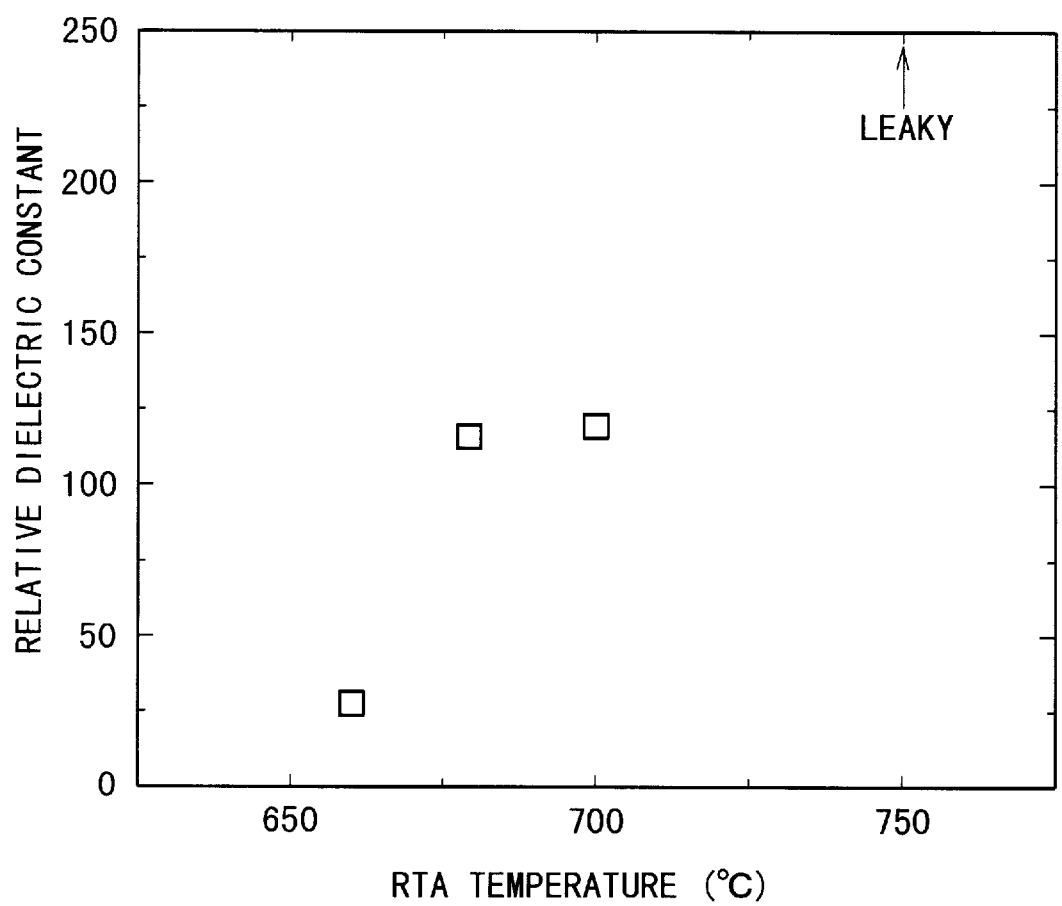
FIG. 10 is a graph shown the relationship between the relative dielectric constant and the RTA temperature in the crystallization process, which was obtained in the first example of FIG. 2.

FIG. 9 shows the RTA-temperature dependence of the leakage current density in the crystallization process, and FIG. 10 shows the RTA-temperature dependence of the relative dielectric constant, FIGS. 9 and 10 were obtained by varying the RTA temperature from 650° C. to 750° C. while keeping the RTA time was fixed as 5 sec.

As seen from FIG. 9, the leakage current density was in the order of $10^{-8}$ A/cm$^2$ when the RTA temperature was varied from 650° C. to 700° C. As seen from FIG. 10, the relative dielectric constant was 25 to 125 when the RTA temperature was varied from 650° C. to 700° C. These values of the leakage current density and the relative dielectric constant were satisfactory for the storage capacitors of LSIs.

The cross section of the thin-film capacitor having the polycrystalline BST thin-film 1 was observed by a Transparent Electron Microscope (TEM). It was found that the perovskite-structured, polycrystalline BST thin-film 1 having the ratio of (Ba+Sr)/Ti of 1.1 to 2.0 had the granular grain structure whose grain size was 7 to 9 nm. The interface of the BST thin-film 1 and the bottom electrode 4 and the interface of the BST thin-film 1 and the top electrode 5 were extremely even, in which the interface unevenness or roughness was 1 to 2 nm.

On the other hand, it was found that the perovskite-structured, polycrystalline BST thin-film having the ratio of (Ba+Sr)/Ti of 1.05 or less had the columnar grain structure. The interface of the BST thin-film and the bottom electrode and the interface of the BST thin-film and the top electrode had an unevenness or roughness of 3 to 6 nm.

Example 2

Figure 11:
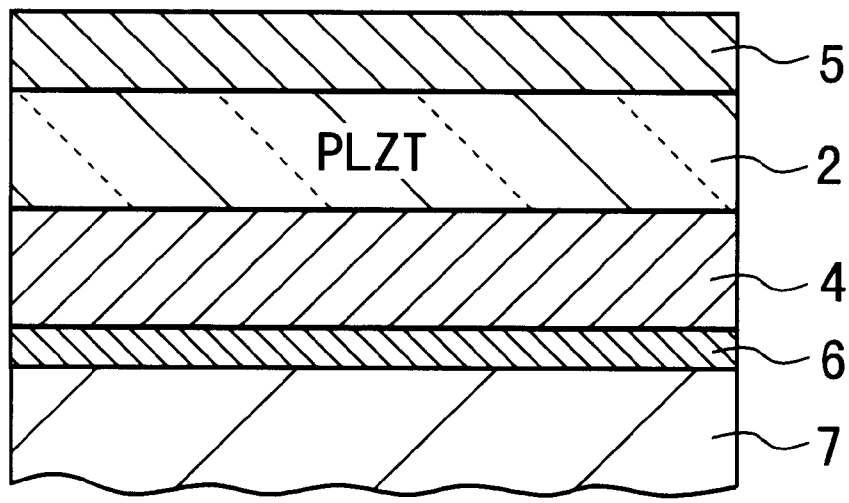
FIG. 11 is a partial cross-section of a thin-film capacitor according to a second example of the present invention.

FIG. 11 shows the partial cross-section of a thin-film capacitor according to an Example 2 of the present invention, in which a PLZT thin-film was used instead of the perovskite-structured, polycrystalline BST thin-film in Example 1.

First, a TiN barrier film 6 (20 nm in thickness) was placed on a main surface of a single-crystal Si substrate 7 (6 inches in diameter) by sputtering. Then, a Ru bottom electrode 4 (100 nm in thickness) was formed on the barrier film 6 by sputtering.

Next, the substrate 7 with the barrier film 6 and the bottom electrode 4 was introduced into the growth chamber 10 of the ECR plasma-enhanced CVD apparatus of FIG. 4. A perovskite-structured, amorphous oxide thin-film 2 (30 nm in thickness) was formed on the bottom electrode 4 at a growth temperature of 100° C. AS the perovskite-structured, amorphous oxide thin-film 2, so-called PLZT [(Pb,La)(Zr,Ti)O$_3$] was used. The ratio of (Pb+La)/(Zr+Ti) was set as 1.1.

Subsequently, the substrate 7 on which the TiN barrier film 6, the Ru bottom electrode 4, and the PLZT capacitor dielectric 2 were stacked was taken out of the chamber 10 of the CVD apparatus, and then, introduced into a chamber of an RTA apparatus (not shown). Int his RTA apparatus, the PLZT perovskite-structured, amorphous oxide thin-film 2 was subjected to heat treatment (i.e., RTA process). In this process, the substrate 7 was placed in an N$_2$ atmosphere while raising the temperature from room temperature to a temperature of 650–750° C. at a rate of 30° C./sec or lower. Then, the substrate 7 was kept in the $N_2$ atmosphere at a temperature of 650 to 750° C. for 1 to 10 seconds. As a result, the PLZT perovskite-structured, amorphous oxide thin-film 2 was crystallized.

Finally, a top electrode 5 (50 nm in thickness) is formed on the PLZT perovskite-structured, polycrystalline oxide thin-film 2 by sputtering. The top electrode 5 also was made of ruthenium.

Through the above-described steps, the thin-film capacitor of Example 2 was completed.

The cross section of the thin-film capacitor having the polycrystalline PLZT thin-film 2 was observed by a TEM. It was found that the perovskite-structured, polycrystalline PLZT thin-film 2 having the ratio of (Pb+La)/(Zr+Ti) of 1.1 had the granular grain structure whose grain size was approximately 7 nm. The interface of the PLZT thin-film 2 and the bottom electrode 4 and the interface of the PLZT thin-film 2 and the top electrode 5 were extremely even, in which the interface unevenness or roughness was 1 to 2 nm.

The electrical property of the thin-film capacitor of Example 2 was measured while applying a voltage of ±1 V across the top and bottom electrodes 5 and 4. As a result, the leakage current density was $1\times10^{-8}$ A/cm$^2$, the relative dielectric constant was 1100, and the dielectric loss was 1% or less. No polarity dependency of the leakage current density was found.

Example 3

Figure 12:
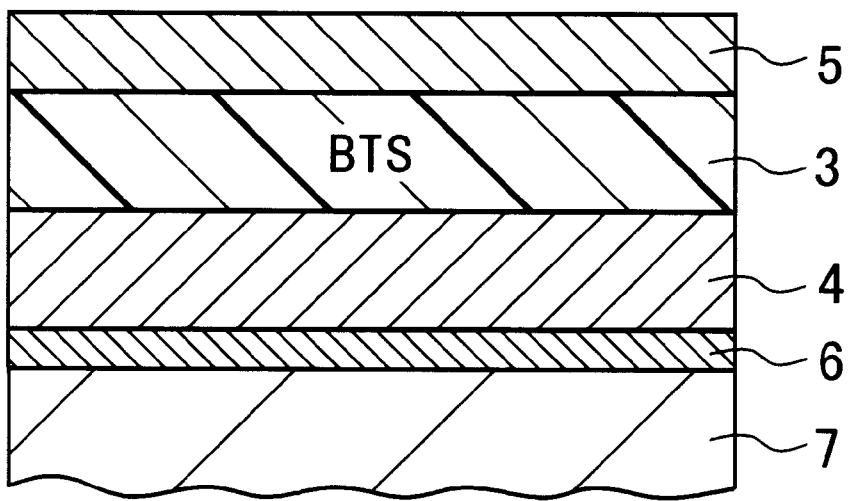
FIG. 12 is a partial cross-section of a thin-film capacitor according to a third example of the present invention.

FIG. 12 shows the partial cross-section of a thin-film capacitor according to an Example 3 of the present invention, in which a BTS thin-film was used instead of the perovskite-structured, polycrystalline BST thin-film in Example 1.

In the same was as that of Example 1, a TiN barrier film 6 (20 nm in thickness) and a Ru bottom electrode 4 (100 nm in thickness) were formed to be stacked on a single-crystal Si substrate 7 (6 inches in diameter) by sputtering.

Next, the substrate 7 with the barrier film 6 and the bottom electrode 4 was introduced into the growth chamber 10 of the ECR plasma-enhanced CVD apparatus of FIG. 4. A perovskite-structured, amorphous oxide thin-film 3 (30 nm in thickness) was formed on the bottom electrode 4 at a growth temperature of 100° C. As the perovskite-structured, amorphous oxide thin-film 3, so-called BST [Ba(Ti,Sn)O$_3$] was used. The ratio of Ba/(Ti+Sn) was set as 1.1.

Subsequently, the substrate 7 on which the TiN barrier film 6, the Ru bottom electrode 4, and the BTS capacitor dielectric 3 were stacked was taken out of the chamber 10 of the CVD apparatus, and then, introduced into a chamber of an RTA apparatus (not shown). In this RTA apparatus, the BTS perovskite-structured, amorphous oxide thin-film 3 was subjected to heat treatment (i.e., RTA process). In this process, the substrate 7 was placed in an $N_2$ atmosphere while raising the temperature from room temperature to a temperature of 650 to 750° C. at a rate of 30° C/sec or lower. Then, the substrate 7 was kept in the $N_2$ atmosphere at a temperature of 650 to 750° C. for 1 to 10 seconds. As a result, the BTS perovskite-structured, amorphous oxide thin-film 3 was crystallized.

Finally, a top electrode 5 (50 nm in thickness) is formed on the BTS perovskite-structured, polycrystalline oxide thin-film 3 by sputtering. The top electrode 5 also was made of ruthenium.

Through the above-described steps, the thin-film capacitor of Example 3 was completed.

The cross section of the thin-film capacitor having the polycrystalline BTS thin-film 3 was observed by a TEM. It was found that the perovskite-structured, polycrystalline BTS thin-film 3 having the ratio of Ba/(Ri+Sn) of 1.1 had the granular structure whose grain size was approximately 7 nm. The interface of the BTS thin-film 3 and the bottom electrode 4 and the interface of the BTS thin-film 3 and the top electrode 5 were extremely even, in which the interface unevenness or roughness was 1 to 2 nm.

The electrical property of the thin-film capacitor according to the Example 3 was measured while applying a voltage of ±1 V across the to and bottom electrodes 5 and 4, the leakage current density was $1\times10^{-8}$ A/cm$^2$, the relative dielectric constant was 300, and the dielectric loss was 1% or less. No polarity dependency of the leakage current density was found.

It is needless to say that the present invention is not limited in the above Examples 1 to 3. For example, the perovskite-structured amorphous oxide thin-films 1, 2, and 3 were formed by the ECR plasma CVD. However, these amorphous thin-films 1, 2, or 3 may be formed any other process than CVD, such as the sol-gel process.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A thin-film capacitor comprising:
   a perovskite-structured, polycrystalline oxide thin-film;
   a bottom electrode located at one side of said thin-film;
   a top electrode located at the other side of said thin-film;
   said oxide thin-film having a general formula of ABO$_3$, where A is at least one element selected from the group consisting of bivalent metallic elements, lead, and lanthanum, and B is at least one element selected from the group consisting of quadrivalent metallic elements;
   a ratio of (A/B) being in a range from 1.1 to 2.0; and
   said oxide thin-film has a granular structure of crystal grains.

2. The capacitor as claimed in claim 1, wherein strontium and barium are included in said bivalent metallic elements of said element A and titanium, zirconium, and tin are included in said quadrivalent metallic elements of said element B.

3. The capacitor as claimed in claim 2, wherein strontium and barium are used as said element A.

4. The capacitor as claimed in claim 2, wherein lead and lanthanum are used as said element A and zirconium and titanium are used as said element B.

5. The capacitor as claimed in claim 2, wherein barium is used as said element A and titanium and tin are used as said element B.

6. The capacitor as claimed in claim 1, wherein each of said top and bottom electrodes is made of at least one selected from the group consisting of ruthenium, iridium, tungsten, and platinum.

7. The capacitor as claimed in claim 1, wherein said bottom electrode is placed over a silicon substrate, and a barrier film is formed to intervene between said silicon substrate and said bottom electrode;
   said barrier film serving to prevent said bottom electrode from reacting with said silicon substrate.

* * * * *